United States Patent
Niboshi et al.

(10) Patent No.: US 8,710,492 B2
(45) Date of Patent: Apr. 29, 2014

(54) ORGANIC EL DISPLAY DEVICE AND METHOD FOR MANUFACTURING THE SAME

(75) Inventors: Manabu Niboshi, Osaka (JP); Takeshi Hirase, Osaka (JP); Yuhki Kobayashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/322,783

(22) PCT Filed: Mar. 3, 2010

(86) PCT No.: PCT/JP2010/001465
§ 371 (c)(1),
(2), (4) Date: Nov. 28, 2011

(87) PCT Pub. No.: WO2010/143337
PCT Pub. Date: Dec. 16, 2010

(65) Prior Publication Data
US 2012/0080671 A1      Apr. 5, 2012

(30) Foreign Application Priority Data
Jun. 11, 2009 (JP) ................................. 2009-140069

(51) Int. Cl.
*H01L 29/06* (2006.01)
(52) U.S. Cl.
USPC .. 257/40; 438/26; 257/E51.018; 257/E51.001
(58) Field of Classification Search
USPC ................ 257/40, E51.018, E51.001; 438/26
See application file for complete search history.

(56) References Cited

U.S. PATENT DOCUMENTS

| | | |
|---|---|---|
| 6,195,142 B1 | 2/2001 | Gyotoku et al. |
| 2005/0269944 A1 | 12/2005 | Su et al. |
| 2006/0194698 A1 | 8/2006 | Gwinn et al. |
| 2007/0090759 A1 | 4/2007 | Choi et al. |
| 2007/0170839 A1 | 7/2007 | Choi et al. |
| 2007/0177069 A1 | 8/2007 | Lee |
| 2008/0106194 A1 | 5/2008 | Logunov et al. |

(Continued)

FOREIGN PATENT DOCUMENTS

| | | |
|---|---|---|
| EP | 1814157 A2 | 8/2007 |
| EP | 1925601 A1 | 5/2008 |
| JP | 10-125463 A | 5/1998 |
| JP | 2002-280169 A | 9/2002 |
| JP | 2005-285354 A | 10/2005 |

(Continued)

OTHER PUBLICATIONS

International Search Report received for PCT Patent Application No. PCT/JP2010/001465, mailed on Jun. 8, 2010, 5 pages (2 pages of English Translation and 3 pages of PCT Search Report).

*Primary Examiner* — Tom Thomas
*Assistant Examiner* — Elias M Ullah
(74) *Attorney, Agent, or Firm* — Morrison & Foerster LLP

(57) ABSTRACT

An organic EL display device (1) includes an element substrate (30), a sealing substrate (20) facing the element substrate (30), an organic EL element (4) provided on the element substrate (30) and between the element substrate (30) and the sealing substrate (20), a first sealing member (5) made of fritted glass and provided between the element substrate (30) and the sealing substrate (20), and configured to weld the element substrate (30) and the sealing substrate (20) to seal the organic EL element (4), a resin member (14) provided between the sealing substrate (20) and the organic EL element (4) and configured to cover a surface of the organic EL element (4), and a second sealing member (16) formed of a resin and provided between the element substrate (30) and the sealing substrate (20).

11 Claims, 13 Drawing Sheets

(56) References Cited

U.S. PATENT DOCUMENTS

| | | |
|---|---|---|
| 2009/0009046 A1 | 1/2009 | Oh et al. |
| 2009/0029623 A1 | 1/2009 | Son et al. |
| 2009/0064717 A1 | 3/2009 | Son et al. |
| 2010/0045177 A1 | 2/2010 | Oh et al. |
| 2010/0045181 A1 | 2/2010 | Oh et al. |
| 2010/0075563 A1 | 3/2010 | Matsui et al. |
| 2011/0001424 A1 | 1/2011 | Logunov et al. |
| 2012/0309122 A1 | 12/2012 | Oh et al. |
| 2013/0095584 A1 | 4/2013 | Oh et al. |

FOREIGN PATENT DOCUMENTS

| | | |
|---|---|---|
| JP | 2007-115692 A | 5/2007 |
| JP | 2007-140061 A | 6/2007 |
| JP | 2007-194184 A | 8/2007 |
| JP | 2007-200846 A | 8/2007 |
| JP | 2008-117767 A | 5/2008 |
| JP | 2008-243379 A | 10/2008 |
| JP | 2009-4351 A | 1/2009 |
| JP | 2009-9923 A | 1/2009 |
| JP | 2009-30058 A | 2/2009 |
| JP | 2010-80087 A | 4/2010 |

ORGANIC EL DISPLAY DEVICE AND METHOD FOR MANUFACTURING THE SAME

CROSS REFERENCE TO RELATED APPLICATIONS

This is a U.S. National Phase patent application of PCT/JP2010/001465, filed Mar. 3, 2010, which claims priority to Japanese Patent Application No. 2009-140069, filed Jun. 11, 2009, each of which is hereby incorporated by reference in the present disclosure in its entirety.

TECHNICAL FIELD

The present invention relates to organic EL display devices including organic electric field light emitting elements (organic electroluminescence elements: hereinafter referred to as "organic EL elements"), and methods for manufacturing the organic EL display devices.

BACKGROUND ART

In recent years, organic EL display devices have received attention as a next-generation flat panel display device. The organic EL display device emits light by itself, and has excellent viewing angle characteristics, high visibility, low power consumption, and a small thickness. Therefore, there is an increasing demand for the organic EL display device.

The organic EL display device includes a plurality of organic EL elements arranged in a predetermined pattern. Each organic EL element includes a first electrode (anode) formed on an insulating substrate, an organic layer having a light emitting layer formed on the first electrode, and a second electrode (cathode) formed on the organic layer.

Here, the organic layer can be damaged by water, and therefore, needs to be shut off from water contained in ambient air. Therefore, conventionally, a technique has been proposed in which the organic layer is sealed between the first substrate on which the organic layer is formed and the second substrate facing the first substrate so that the organic layer is shut off from water. More specifically, an organic EL display device has been proposed in which the first and second substrates are bonded together using a resinous adhesive material to seal the organic layer.

However, in this organic EL display device, the adhesive material is made of a resin and therefore transmits water contained in ambient air, and therefore, it is difficult to completely shut out water. The adhesive material made of a resin transmits oxygen contained in ambient air as well. Therefore, the second electrode formed on the organic layer is oxidized, so that the performance of the second electrode is disadvantageously lowered.

Therefore, an organic EL display device has been proposed which employs a sealing member made of fritted glass (low-melting-point glass) instead of the adhesive material made of a resin. If the sealing member made of fritted glass is used to seal the organic layer, the organic layer can be shut off from water and oxygen better than when the adhesive material made of a resin is used, so that the sealing performance of the sealing member is improved.

However, the sealing member is formed along the circumference of the organic layer, and therefore, a space is formed inside the sealing member (i.e., between the organic layer formed on the first substrate, and the second substrate). Therefore, in particular, in the case of a large-size organic EL display device employing glass substrates as the first and second substrates, the glass substrates are warped in the space by their own heavy weight, so that the first and second substrates contact each other, and therefore, the mechanical strength of the organic EL display device is disadvantageously lowered.

Therefore, a technique has been described to improve the mechanical strength of the organic EL display device employing a sealing member made of fitted glass. More specifically, a resin member made of a urethane acrylic resin is provided in the space formed between the organic layer formed on the first substrate, and the second substrate. The resin member is formed in the following manner: the urethane acrylic resin is injected inside the sealing member made of fritted glass formed along the circumference of the organic layer, and thereafter, the urethane acrylic resin is cured by irradiation with light or heating, thereby forming a film-like resin member (see, for example, PATENT DOCUMENT 1).

CITATION LIST

Patent Document

PATENT DOCUMENT 1: Japanese Patent Publication No. 2007-115692

SUMMARY OF THE INVENTION

Technical Problem

In the structure of PATENT DOCUMENT 1, however, as described above, a resin material is injected inside the sealing member, and thereafter, the resin material is cured by irradiation with light or heating, thereby forming a film-like resin member. Therefore, there is the following drawback. Specifically, the film-like resin member has a large thickness (30 μm or more). Therefore, the volume of the resin member is large in a large-size organic EL display device, resulting in a disadvantageous increase in cost. Also, in order to ensure sealing performance, the thickness of the sealing member made of fritted glass needs to be set to be larger than or equal to the thickness of the resin member. However, as the thickness of the resin member is increased, it is invariably necessary to increase the thickness of the sealing member as well. As a result, for example, when laser is used to melt the sealing member made of fritted glass to weld the first and second substrates, a large amount of heating energy is required, resulting in a disadvantageous increase in cost. Also, if the thickness of the resin member is larger than the thickness of the sealing member, a gap occurs between the sealing member and the first or second substrate, so that the sealing member does not completely shuts out water and oxygen contained in ambient air, and therefore, the sealing performance of the sealing member is disadvantageously reduced.

Therefore, the present invention has been made in view of the above problems. It is an object of the present invention to provide an organic EL display device in which the thickness of the resin member can be decreased to reduce cost, and a degradation in the sealing performance of the sealing member can be reduced or prevented, and a method for manufacturing the organic EL display device.

Solution to the Problem

To achieve the object, an organic EL display device of the present invention includes a first substrate, a second substrate facing the first substrate, an organic EL element formed on the first substrate and provided between the first substrate and the second substrate, a first sealing member formed of fritted glass and provided between the first substrate and the second substrate, and configured to weld the first substrate and the second substrate to seal the organic EL element, a resin member provided between the second substrate and the organic EL element and configured to cover a surface of the organic EL element, and a second sealing member made of a resin and provided between the first substrate and the second substrate.

With this configuration, the second sealing member formed of a resin is provided between the first substrate and the second substrate. Therefore, the second sealing member formed of a resin, which is flexible, functions as a pressure wall for maintaining the vacuum state of the inside of the attached substrates (i.e., the first substrate and the second substrate), and therefore, the resin member can be formed using the one drop filling technique. As a result, the resin member having a small thickness can be formed. The thinner resin member can reduce the amount of a resin material used to form the resin member even in a large-size organic EL display device. As a result, an increase in cost can be reduced.

Because the thickness of the resin member is reduced, the thickness of the first sealing member made of fritted glass can also be reduced. As a result, the heating energy which is required when a laser is used to perform welding using the first sealing member made of fritted glass can be reduced. As a result, an increase in cost can be reduced.

The thickness of the resin member can be prevented from being greater than the thickness of the first sealing member. Therefore, for example, when the first sealing member is formed on the second substrate, a gap can be prevented from occurring between the first sealing member and the first substrate. Therefore, the first sealing member can reliably shut out water and oxygen contained in ambient air, and therefore, the reduction in the sealing performance of the first sealing member can be reliably reduced or prevented.

Because the resin member is formed using the one drop filling technique, the positioning accuracy can be improved when the resin member is formed. Therefore, the production step of the resin member can be simplified, whereby the productivity of the organic EL display device can be improved and therefore the yield can be increased.

In the organic EL display device of the present invention, the second sealing member may contain a spacer configured to regulate a thickness of the resin member.

With this configuration, the second sealing member contains a spacer for regulating the thickness of the resin member. Therefore, even when the resin member is formed using the one drop filling technique, the thickness of the resin member can be accurately regulated.

In the organic EL display device of the present invention, a relationship $H_1 \geq D_1$ may be established, where $H_1$ is a height of the first sealing member, and $D_1$ is a diameter of the spacer.

With this configuration, if the first sealing member is provided on the second substrate, then when the first substrate and the second substrate are attached together via the first sealing member, the first sealing member and the second substrate are allowed to reliably contact each other, whereby a gap can be reliably prevented from occurring between the first sealing member and the second substrate.

In the organic EL display device of the present invention, the second sealing member may be provided inside the first sealing member in a plane direction of the organic EL display device.

With this configuration, the second sealing member is provided inside the first sealing member in the plane direction of the organic EL display device. Therefore, the second sealing member can separate the resin member apart from the first sealing member, whereby heat transfer to the organic EL element can be reduced when the first sealing member is heated to weld the first substrate and the second substrate. Also, it is possible to reduce or prevent alteration of the resin member which is caused by heat when the first sealing member is melted.

In the organic EL display device of the present invention, the second sealing member may be provided outside the first sealing member in a plane direction of the organic EL display device.

With this configuration, the second sealing member is provided outside the first sealing member in the plane direction of the organic EL display device. Therefore, when the second sealing member is formed after the first sealing member is formed, the second sealing member is more easily formed.

In the organic EL display device of the present invention, the first sealing member and the second sealing member may be separated apart from each other in a plane direction of the organic EL display device.

With this configuration, the first sealing member and the second sealing member are separated apart from each other in the plane direction of the organic EL display device. Therefore, transfer to the second sealing member of heat occurring when the first substrate and the second substrate are welded by heating the first sealing member made of fritted glass can be reduced or prevented. As a result, alteration of the second sealing member formed of a resin due to heat can be reduced or prevented.

In the organic EL display device of the present invention, the resin may be an acrylic resin or an epoxy resin.

With this configuration, the second sealing member can be formed of a low-cost and versatile resin material.

In the organic EL display device of the present invention, a light blocking member having a capability of transmitting visible light and a capability of blocking ultraviolet light may be provided on a surface of the organic EL element.

With this configuration, for example, when the resin member and the second sealing member are formed by curing by irradiation with ultraviolet light, ultraviolet light entering the organic EL element can be reliably reduced or prevented. As a result, a degradation in the organic EL element caused by irradiation with ultraviolet light can be reduced or prevented. Also, the light blocking member has a capability of transmitting visible light, and therefore, the organic EL display device is applicable to any of the following types: bottom emission type, in which light is extracted through the first substrate; top emission type, in which light is extracted through the second substrate; and double-sided emission type, in which light is extracted through both the first substrate and the second substrate.

In the organic EL display device of the present invention, the resin member having a small thickness can be formed. Therefore, even in a large-size organic EL display device, the amount of a resin material for the resin member can be reduced. As a result, an increase in cost can be reduced or prevented, which is an excellent property. Therefore, the present invention is preferably used in an organic EL display device including the resin member having a thickness in a range of 3 μm to 20 μm, both inclusive.

A method for manufacturing an organic EL display device according to the present invention includes at least an organic EL element formation step of forming an organic EL element on a first substrate, a first sealing member formation step of forming a frame-like first sealing member made of fritted glass on a second substrate, a second sealing member formation step of forming a frame-like second sealing member made of a resin on the second substrate on which the first sealing member has been formed, a one drop filling step of dropping and injecting a resin material for forming a resin member inside the second sealing member formed on the second substrate, a two-substrate structure formation step of attaching the first substrate and the second substrate together with the first sealing member and the second sealing member being interposed therebetween, in a vacuum atmosphere, and allowing the resin material to uniformly spread inside the second sealing member, a resin curing step of curing the resin material to form the resin member and curing the resin included in the second sealing member, a welding step of heating the first sealing member made of fritted glass to weld the first substrate and the second substrate using the first sealing member.

With this configuration, the second sealing member formed of a resin is provided between the first substrate and the second substrate. Therefore, the second sealing member formed of a resin, which is flexible, functions as a pressure wall for maintaining the vacuum state of the inside of the attached substrates (i.e., the first substrate and the second substrate), whereby the vacuum state of the inside of the attached substrates in which the dropped and injected resin material which will form the resin member is present can be maintained. Therefore, even if a resin material, which has a high viscosity, is dropped and injected, the dropped and injected resin material can be spread by applying pressure when the first substrate and the second substrate are attached together in a vacuum atmosphere. As a result, the resin member having a small thickness can be formed. The thinner resin member can reduce the amount of a resin material used to form the resin member even in a large-size organic EL display device. As a result, an increase in cost can be reduced.

Because the thickness of the resin member is reduced, the thickness of the first sealing member made of fritted glass can also be reduced. As a result, the heating energy which is required when a laser is used to perform welding using the first sealing member made of fritted glass can be reduced. As a result, an increase in cost can be reduced.

Because the thickness of the resin member can be prevented from being greater than the thickness of the first sealing member, a gap can be prevented from occurring between the first sealing member and the first substrate. Therefore, the first sealing member can reliably shut out water and oxygen contained in ambient air, and therefore, the reduction in the sealing performance of the first sealing member can be reliably reduced or prevented.

Because the resin member is formed using the one drop filling technique, the positioning accuracy can be improved when the resin member is formed. Therefore, the production step of the resin member can be simplified, whereby the productivity of the organic EL display device can be improved and therefore the yield can be increased.

In the organic EL display device manufacturing method of the present invention, in the welding step, only a portion in a width direction of the first sealing member may be heated.

With this configuration, the first sealing member has a region which is not heated, and therefore, the heat capacity of the first sealing member is increased, whereby an increase in temperature of the inner portion of the first sealing member can be reduced or avoided. Therefore, for example, when a laser is used to perform welding using the first sealing member made of fritted glass, physical transfer to the organic EL element of the temperature increase of the first sealing member caused by irradiation with laser light can be effectively reduced or prevented. As a result, damage to the organic EL element caused by heat transfer can be reduced.

Advantages of the Invention

According to the present invention, an increase in cost can be reduced or prevented, and a reduction in sealing performance of the first sealing member can be reliably reduced or prevented. Also, the productivity of the organic EL display device can be increased and therefore the yield can be increased.

DESCRIPTION OF EMBODIMENTS

Embodiments of the present invention will be described in detail hereinafter with reference to the accompanying drawings. Note that the present invention is not limited to the embodiments described below.

First Embodiment

Figure 1:
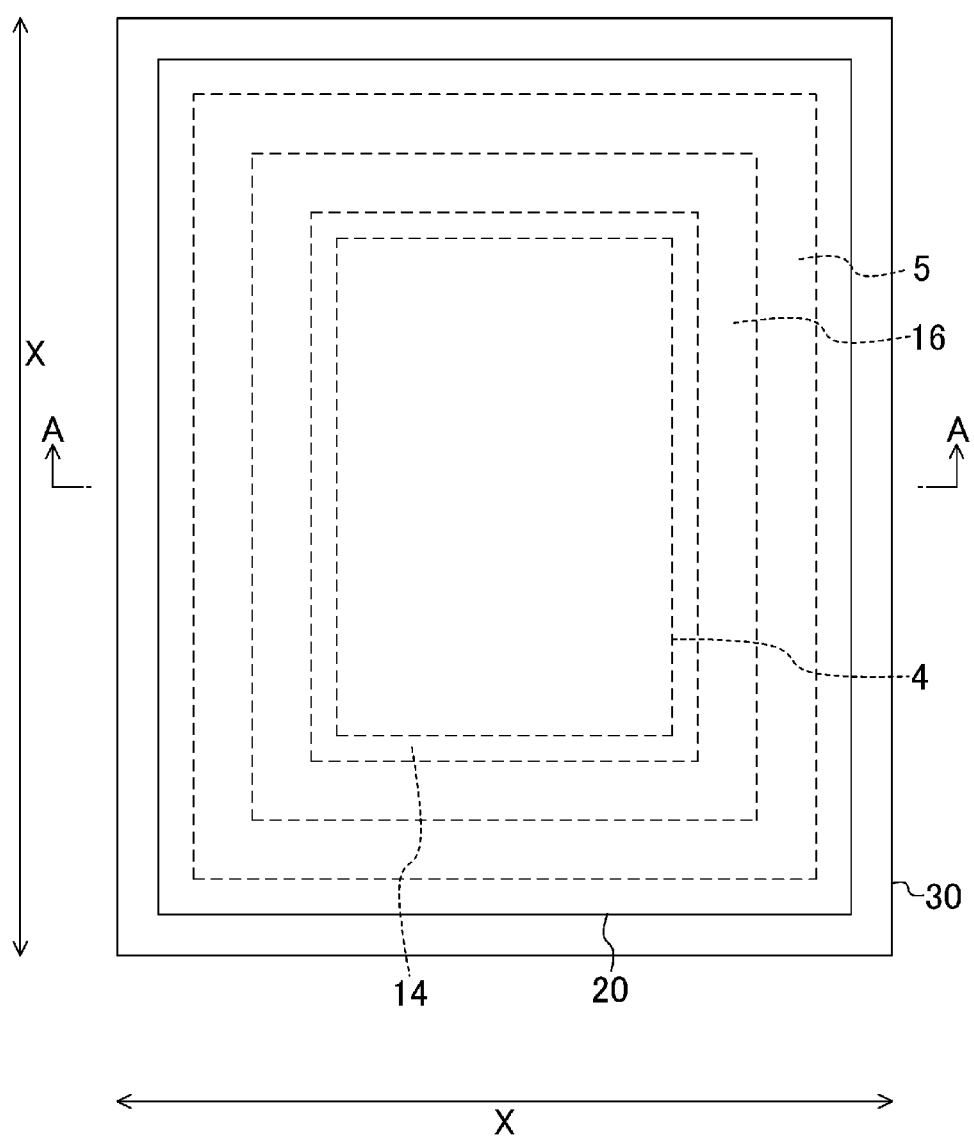
FIG. 1 is a plan view of an organic EL display device according to a first embodiment of the present invention.
Figure 2:
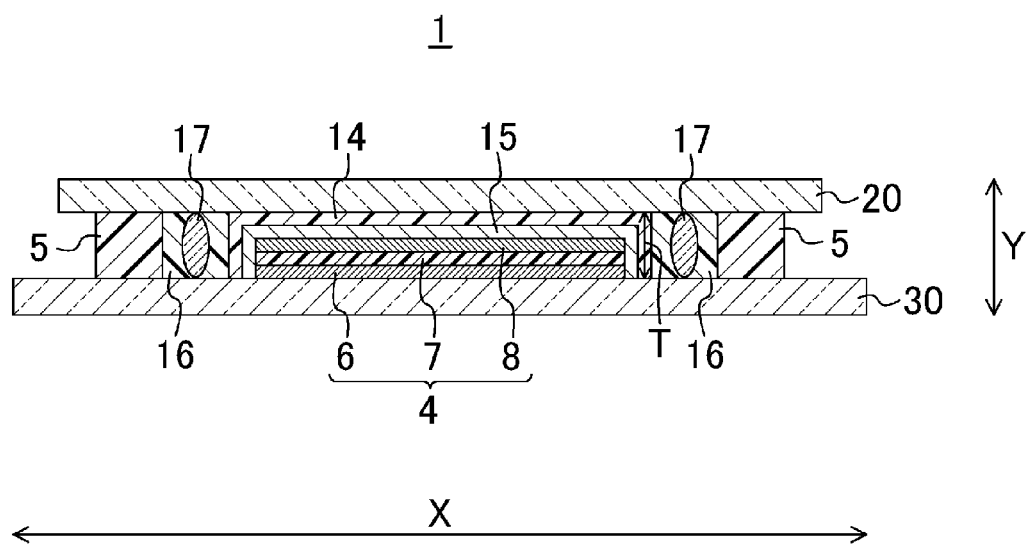
FIG. 2 is a cross-sectional view taken along line A-A of FIG. 1.
Figure 3:
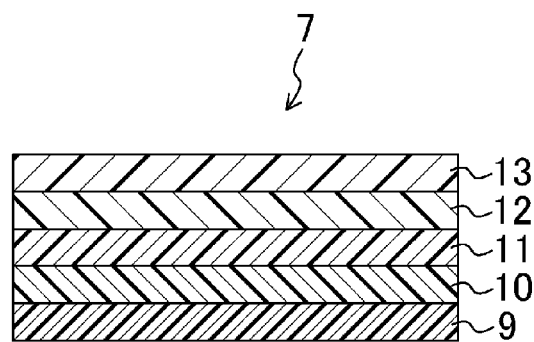
FIG. 3 is a cross-sectional view for describing an organic layer included in an organic EL element provided in organic EL display devices of embodiments of the present invention.

FIG. 1 is a plan view of an organic EL display device according to a first embodiment of the present invention. FIG. 2 is a cross-sectional view taken along line A-A of FIG. 1. FIG. 3 is a cross-sectional view for describing an organic layer included in an organic EL element provided in organic EL display devices of the embodiments of the present invention.

As shown in FIGS. 1 and 2, the organic EL display device 1 includes an element substrate 30 (first substrate), a sealing substrate 20 (second substrate) facing the element substrate 30, and an organic EL element 4 which is formed on the element substrate 30 and provided between the element substrate 30 and the sealing substrate 20. The organic EL display device 1 further includes a first sealing member 5 which is used to join (or join by melting (also referred to as "weld")) the element substrate 30 and the sealing substrate 20 together to seal the organic EL element 4. The first sealing member 5 is formed in the shape of a frame extending along a circumference of the organic EL element 4. The element substrate 30 and the sealing substrate 20 are attached to each other via the first sealing member 5.

The element substrate 30 and the sealing substrate 20 are formed of, for example, an insulating material, such as glass, plastic, etc.

As shown in FIG. 2, the organic EL element 4 includes a first electrode 6 (anode) provided on a surface of the element substrate 30, an organic layer 7 provided on a surface of the first electrode 6, and a second electrode 8 (cathode) provided on a surface of the organic layer 7.

There are a plurality of the first electrodes 6 spaced at predetermined intervals and arranged in a matrix on the surface of the element substrate 30. Each of the first electrodes 6 forms a corresponding pixel region of the organic EL display device 1. Note that the first electrode 6 is formed of, for example, Au, Ni, Pt, ITO (indium-tin oxide), a multilayer film of ITO and Ag, or the like.

The organic layer 7 is formed on the surface of each of the first electrodes 6 arranged in a matrix. As shown in FIG. 3, the organic layer 7 includes a hole injection layer 9, a hole transport layer 10 formed on a surface of the hole injection layer 9, a light emitting layer 11 formed on a surface of the hole transport layer 10 and for emitting any of red, green, and blue light, an electron transport layer 12 formed on a surface of the light emitting layer 11, and an electron injection layer 13 formed on a surface of the electron transport layer 12. The hole injection layer 9, the hole transport layer 10, the light emitting layer 11, the electron transport layer 12, and the electron injection layer 13 are successively stacked to form the organic layer 7.

The hole injection layer 9 is used to enhance the efficiency of injection of holes into the light emitting layer 11. Examples of a material for the hole injection layer 9 include benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or derivatives thereof, or heterocyclic conjugated monomers, oligomers, or polymers, such as polysilane compounds, vinylcarbazole compounds, thiophene compounds, aniline-based compounds, etc.

Similar to the hole injection layer 9, the hole transport layer 10 is used to enhance the efficiency of injection of holes into the light emitting layer 11. The hole transport layer 10 may be made of a material similar to that for the hole injection layer 9.

When a voltage is applied to the light emitting layer 11 via the first electrode 6 and the second electrode 8, holes and electrons are injected from the electrodes into the light emitting layer 11, in which the holes and the electrons are recombined. The light emitting layer 11 is formed of a material having a high light emission efficiency. Examples of such a material include organic materials, such as low molecular-weight fluorescent dyes, fluorescent macromolecules, metal complexes, etc. More specifically, examples of the material include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or derivatives thereof, tris(8-quinolinato)aluminum complex, bis(benzoquinolinato)beryllium complex, tri(dibenzoylmethyl)phenanthroline europium complex, and ditoluoylvinylbiphenyl.

The electron transport layer 12 is used to transport electrons injected from the second electrode 8 to the light emitting layer 11. Examples of a material for the electron transport layer 12 include quinoline, perylene, phenanthroline, bisstyryl, pyrazine, triazole, oxazole, oxadiazole, fluorenone, or derivatives and metal complexes thereof. More specifically, examples of the material include tris(8-hydroxyquinoline) aluminum, anthracene, naphthalene, phenanthrene, pyrene, anthracene, perylene, butadiene, coumarin, acridine, stilbene, 1,10-phenanthroline, or derivatives and metal complexes thereof.

Similar to the electron transport layer 12, the electron injection layer 13 is used to transfer electrons injected from the second electrode 8 to the light emitting layer 11. The electron injection layer 13 is formed of a material similar to that for the electron transport layer 12.

The second electrode 8 has a function of injecting electrons into the organic layer 7. The second electrode 8 is formed of, for example, a magnesium alloy (e.g., MgAg etc.), an aluminum alloy (e.g., AlLi, AlCa, AlMg, etc.), metallic calcium, a metal having a low work function, etc.

The first sealing member 5 is made of fritted glass (low-melting-point glass) and has a function of shutting out water and oxygen contained in ambient air. For example, fritted glass may be prepared using a fine powder obtained by pulverizing mixed glass made of oxides, such as $SiO_2$ (silicon oxide), $B_2O_3$ (boron oxide), $Al_2O_3$ (aluminum oxide), $V_2O_5$ (vanadium oxide), CuO (copper oxide), etc.

As shown in FIG. 2, the organic EL display device 1 includes a resin member 14 made of a resin. The resin member 14 is used to improve the mechanical strength of the organic EL display device 1 employing the first sealing member 5 made of fritted glass. Examples of the resin forming the resin member 14 includes ultraviolet curable resins and thermosetting resins, such as acrylic resins, epoxy resins, etc.

Note that, in this embodiment, as shown in FIG. 2, a protection film 15 which prevents the organic EL element 4 and the resin member 14 from contacting each other to protect the organic EL element 4 is formed on the organic EL element 4. The protection film 15 is formed of, for example, an inorganic material, such as $SiO_2$, SiON, etc.

Here, in the organic EL display device of this embodiment, as shown in FIG. 2, a second sealing member 16 formed of a resin is provided between the element substrate 30 and the sealing substrate 20.

As shown in FIG. 1, the second sealing member 16 is formed in the shape of a frame extending along the circumference of the organic EL element 4, similar to the first sealing member 5 formed of fritted glass. Also, as shown in FIGS. 1 and 2, in this embodiment, the second sealing member 16 is provided inside the first sealing member 5 in a plane direction X of the organic EL display device 1 (i.e., a direction indicated by an arrow X in FIGS. 1 and 2 which is a direction perpendicular to a thickness direction Y of the organic EL display device 1). More specifically, the second sealing member 16 is provided between the organic EL element 4 (or the resin member 14) and the first sealing member 5 in the plane direction X of the organic EL display device 1 (i.e., on a side closer to the organic EL element 4 (or the resin member 14) of the first sealing member 5 in the plane direction X).

The second sealing member 16 is not particularly limited and may be formed of a low-cost and versatile resin material, such as an epoxy resin, an acrylic resin, etc. Note that, of these resins, an acrylic resin is preferably used because the second sealing member 16 can be formed at lower cost.

The second sealing member 16 contains a spacer 17 which regulates a thickness of the resin member 14 (see FIG. 2). The spacer 17 is formed of, for example, $SiO_2$ (silicon oxide).

By providing the second sealing member 16 formed of a resin, the resin member 14 can be formed using a one drop filling technique, which is employed as a technique of injecting a liquid crystal material.

Typically, for liquid crystal display panels, a liquid crystal material is injected into a gap between a pair of substrates by the following techniques: vacuum injection; and one drop filling. Of these techniques, in the one drop filling technique, for example, a frame-like sealing member is formed along a circumference of a TFT substrate, and in a vacuum atmosphere, a liquid crystal material is dropped onto the TFT substrate within the frame of the sealing member, and the TFT substrate having the dropped liquid crystal material and a CF substrate are attached together. Next, the substrates are returned to the atmosphere, so that the liquid crystal material between the TFT substrate and the CF substrate attached together is allowed to spread by atmospheric pressure. Thereafter, the sealing member is irradiated with ultraviolet light to be cured. Thus, a liquid crystal display panel is manufactured.

Compared to the vacuum injection technique, which has been conventionally widely used, the one drop filling technique can reduce the thickness of the liquid crystal layer, and therefore, significantly reduce the amount of the liquid crystal material, and in addition, can reduce the time required to inject the liquid crystal material. Therefore, the manufacturing cost of the liquid crystal display panel can be reduced, and the productivity can be improved.

Here, in the one drop filling technique for liquid crystal materials, a liquid crystal material, which is a low viscosity material, is dropped and injected. In the one drop filling technique for the resin material for the resin member 14 in this embodiment, the resin material having a higher viscosity than that of liquid crystal materials is dropped and injected, and therefore, when the element substrate 30 and the sealing substrate 20 are attached together in a vacuum atmosphere, the dropped and injected resin material is not spread unless pressure is applied, which is a problem.

Therefore, while the element substrate 30 and the sealing substrate 20 are attached together via the first sealing member 5, it is necessary to maintain the vacuum state of the inside of the attached substrates in which the resin material is sealed by the first sealing member 5. However, the first sealing member 5 is formed by heating and baking after a paste material obtained by adding fritted glass into an organic solvent is applied thereto. Therefore, when the element substrate 30 and the sealing substrate 20 are attached together, the organic solvent has been completely removed. Therefore, the first sealing member 5 is lack of flexibility, and therefore, the first sealing member 5 cannot be used as a pressure wall for maintaining the vacuum state of the inside of the attached substrates.

Therefore, as described above, the second sealing member 16 formed of a resin is provided between the element substrate 30 and the sealing substrate 20. With this configuration, the second sealing member 16 formed of a resin, which is flexible, functions as a pressure wall for maintaining the vacuum state of the inside of the attached substrates, whereby the vacuum state of the inside of the attached substrates in which the dropped and injected resin material which will form the resin member 14 is present can be maintained. Therefore, even if a resin material, which has a higher viscosity than that of liquid crystal materials, is dropped and injected, the dropped and injected resin material can be spread by applying pressure when the element substrate 30 and the sealing substrate 20 are attached together in a vacuum atmosphere.

Thus, by providing the second sealing member 16 formed of a resin, the resin member 14 formed of a resin can be formed using the one drop filling technique.

In this case, the resin member 14 having a small thickness T (see FIG. 2) (e.g., in a range of 3 μm to 20 μm, both inclusive) can be formed, i.e., the thickness of the resin member 14 can be reduced. Therefore, even in a large-size organic EL display device (e.g., the width is 265 mm or more, the length is 200 mm or more, and the thickness is in a range of 0.3 mm to 0.7 mm, both inclusive), the amount of a resin material for the resin member 14 can be reduced. As a result, an increase in cost can be reduced or prevented.

Note that the thickness T of the resin member 14 is preferably in a range of 5 μm to 15 μm, both inclusive, more preferably in a range of 6 μm to 8 μm, both inclusive.

Because the thickness of the resin member 14 is reduced, the thickness of the first sealing member 5 made of fritted glass can also be reduced. For example, when the thickness T of the resin member 14 is in a range of 3 μm to 20 μm, both inclusive, the thickness of the first sealing member 5 can be set to be in a range of 3 μm to 20 μm, both inclusive. As a result, for example, when a laser is used to melt the first sealing member 5 made of fritted glass to weld the element substrate 30 and the sealing substrate 20, the thermal energy can be reduced. As a result, an increase in cost can be reduced or prevented.

The thickness of the resin member 14 can be prevented from exceeding the thickness of the first sealing member 5, whereby a gap between the first sealing member 5 and the element substrate 30 can be reduced or prevented. Therefore, the first sealing member 5 can reliably shut out water and oxygen contained in ambient air, whereby a reduction in the sealing performance of the first sealing member 5 can be reliably reduced or prevented.

The resin member 14 is formed using the one drop filling technique. Therefore, the positioning accuracy of formation of the resin member 14 can be improved. Therefore, the production step of the resin member 14 can be simplified, resulting in an increase in productivity of the organic EL display device 1, and therefore, an increase in yield.

Next, an example method for manufacturing the organic EL display device of this embodiment will be described. FIGS. 4-15 are diagrams for describing a method for manufacturing the organic EL display device of the first embodiment of the present invention.

<Organic EL Element Formation Step>

Figure 4:
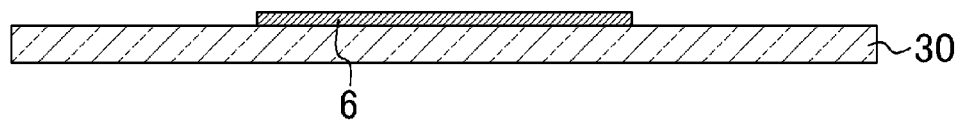
FIG. 4 is a diagram for describing a method for manufacturing the organic EL display device of the first embodiment of the present invention.

Initially, as shown in FIG. 4, the first electrode 6 is formed on the element substrate 30 which is, for example, a glass substrate having a substrate size of 300×400 mm and a thickness of 0.7 mm, by forming a patterned ITO film by sputtering. In this case, the first electrode 6 has a thickness of, for example, about 150 nm.

Next, the organic layer 7 including the light emitting layer 11, and the second electrode 8, are formed on the first electrode 6 by vapor deposition using a metal mask.

More specifically, initially, the element substrate 30 including the first electrode 6 is placed in a chamber of a vapor deposition apparatus. Note that the inside of the chamber of the vapor deposition apparatus is kept at a vacuum degree of $1\times10^{-6}$ to $1\times10^{-4}$ (Pa) using a vacuum pump. The element substrate 30 including the first electrode 6 is held by a pair of supports attached to the inside of the chamber with two edges of the element substrate 30 being fixed to the supports.

Figure 5:
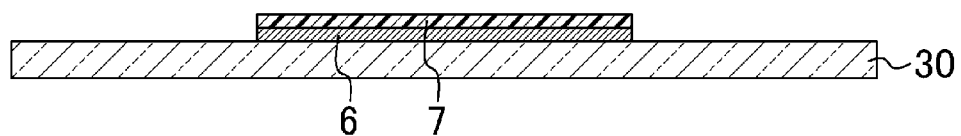
FIG. 5 is a diagram for describing the method for manufacturing the organic EL display device of the first embodiment of the present invention.

Thereafter, vapor deposition materials for the hole injection layer 9, the hole transport layer 10, the light emitting layer 11, the electron transport layer 12, and the electron injection layer 13 are successively vaporized from a vapor deposition source to form and stack the hole injection layer 9, the hole transport layer 10, the light emitting layer 11, the electron transport layer 12, and the electron injection layer 13. As a result, as shown in FIG. 5, the organic layer 7 is formed in the pixel region.

Figure 6:
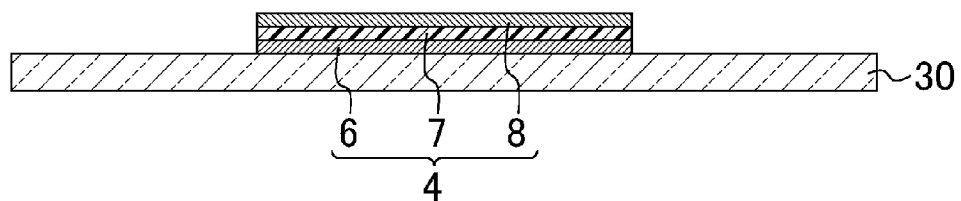
FIG. 6 is a diagram for describing the method for manufacturing the organic EL display device of the first embodiment of the present invention.

Thereafter, as shown in FIG. 6, the second electrode 8 is formed on the organic layer 7. Thus, the organic EL element 4 including the first electrode 6, the organic layer 7, and the second electrode 8 is formed on the element substrate 30.

Note that the vapor deposition source may be, for example, a crucible containing the vapor deposition materials. The crucible is placed in a lower portion inside the chamber. The crucible has a heater which heats the crucible. If the internal temperature of the crucible reaches the vaporization temperature of each vapor deposition material by heat of the heater, the vapor deposition material contained in the crucible is vaporized, i.e., the vaporized molecules escape upward from the material in the chamber.

The organic layer 7 and the second electrode 8 are specifically formed as follows. Initially, the hole injection layer 9 made of m-MTDATA (4,4,4-tris(3-methylphenylphenylamino)triphenylamine) having a thickness of, for example, 25 nm, which is common to all R, G, and B pixels, is formed on the patterned first electrode 6 provided on the element substrate 30 using a mask. Next, the hole transport layer 10 made of α-NPD(4,4-bis(N-1-naphthyl-N-phenylamino)biphenyl) having a thickness of, for example, 30 nm, which is common to all R, G, and B pixels, is formed on the hole injection layer 9 using a mask. Next, as the light emitting layer 11 for a red color, a mixture of di(2-naphthyl)anthracene (ADN) and 2,6-bis((4'-methoxydiphenylamino)styryl)-1,5-dicyanonaphthalene (BSN) (30 wt %) having a thickness of, for example, 30 nm is formed on the hole transport layer 10 formed in the corresponding pixel regions using a mask. Next, as the light emitting layer 11 for a green color, a mixture of ADN and coumarin 6 (5 wt %) having a thickness of, for example, 30 nm is formed on the hole transport layer 10 formed on the corresponding pixel regions using a mask. Next, the light emitting layer 11 as a blue color, a mixture of ADN and 4,4'-bis(2-{4-(N,N-diphenylamino)phenyl}vinyl)biphenyl (DPAVBi) (2.5 wt %) having a thickness of, for example, 30 nm is formed on the hole transport layer 10 formed on the corresponding pixel regions using mask. Next, as the electron transport layer 12, 8-hydroxyquinolinealuminum (Alq3) having a thickness of, for example, 20 nm, which is common to all R, G, and B pixels, is formed on each light emitting layer 11 using a mask. Next, as the electron injection layer 13, lithium fluoride (LiF) having a thickness of, for example, 0.3 nm is formed on the electron transport layer 12 using a mask. Thereafter, as the second electrode 8, a cathode made of magnesium silver (MgAg) having a thickness of, for example, 10 nm is formed.

Figure 7:
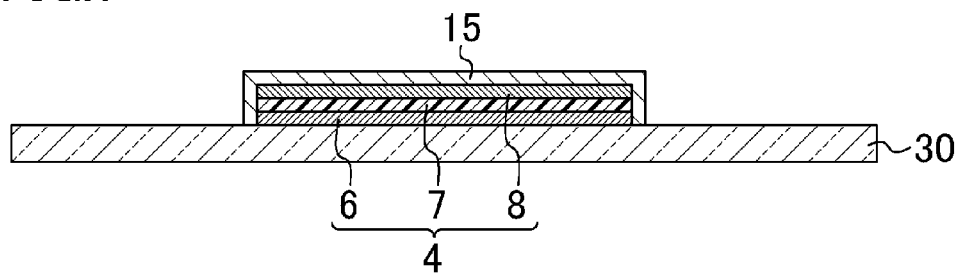
FIG. 7 is a diagram for describing the method for manufacturing the organic EL display device of the first embodiment of the present invention.

Next, as shown in FIG. 7, the protection film 15 for protecting the organic EL element 4 is formed on a surface of the organic EL element 4. The protection film 15 may be formed by forming a layer made of an inorganic material, such as $SiO_2$, SiON, etc., on the surface of the organic EL element 4 by vapor deposition, sputtering, chemical vapor deposition, etc.

<First Sealing Member Formation Step>

Figure 8:
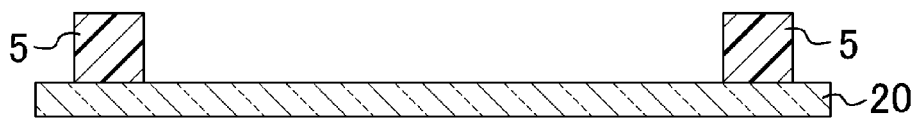
FIG. 8 is a diagram for describing the method for manufacturing the organic EL display device of the first embodiment of the present invention.
Figure 11:
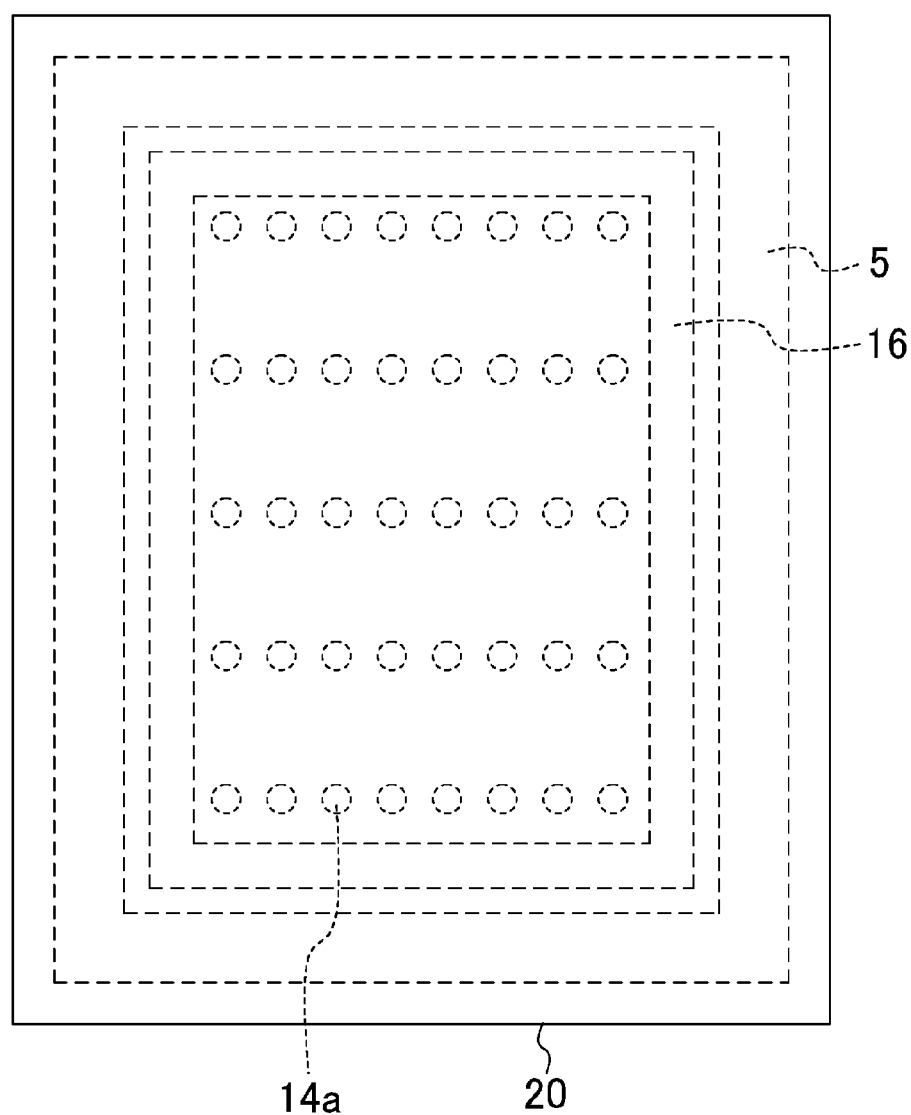
FIG. 11 is a diagram for describing the method for manufacturing the organic EL display device of the first embodiment of the present invention.

Initially, as shown in FIGS. 8 and 11, a paste material obtained by adding fritted glass to the aforementioned organic solvent is applied onto the sealing substrate 20 (e.g., a glass substrate having a substrate size of 95×95 mm and a thickness of 0.7 mm) by using a dispenser, screen printing, etc., and is then preliminarily baked by heating, to form the frame-like first sealing member 5 made of fritted glass.

Note that the heating temperature for the preliminary baking is preferably in a range of 200° C. to 500° C., both inclusive, more preferably in a range of 250° C. to 400° C., both inclusive. This is because if the organic solvent of the paste material is not completely removed by the preliminary baking, the organic solvent may cause outgassing during the main baking, which may interfere with welding employing the first sealing member 5 made of fritted glass described below.

<Second Sealing Member Formation Step>

Figure 9:
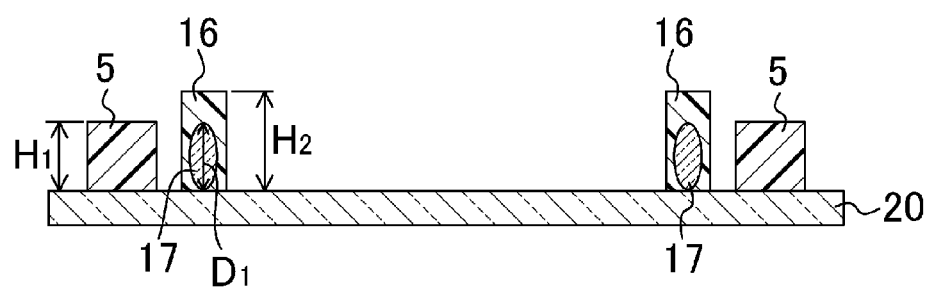
FIG. 9 is a diagram for describing the method for manufacturing the organic EL display device of the first embodiment of the present invention.

Next, as shown in FIGS. 9 and 11, the frame-like second sealing member 16 made of an ultraviolet curable resin or a thermosetting resin, such as an acrylic resin, an epoxy resin, etc., is formed (drawn) on the sealing substrate 20 including the first sealing member 5 using, for example, a dispenser.

In this case, as shown in FIGS. 9 and 11, the frame-like second sealing member 16 is formed (drawn) inside the first sealing member 5. The second sealing member 16 is formed to have a high viscosity (100-1000 Pa·s).

As shown in FIG. 9, in order to maintain hermeticity (high vacuum state) for applying pressure by vacuum when the element substrate 30 and the sealing substrate 20 are attached together by vacuum, the second sealing member 16 is formed so that the second sealing member 16 has a greater height than that of the first sealing member 5. Specifically, the second sealing member 16 is formed so that a relationship $H_1 < H_2$ is established, where $H_1$ is the height of the first sealing member 5, and $H_2$ is the height of the second sealing member 16.

As described above, the spacer 17 for regulating the thickness of the resin member 14 is contained in the second sealing member 16. The spacer 17 has a diameter which is smaller than or equal to the height of the first sealing member 5. More specifically, the diameter of the spacer 17 is set so that a relationship $H_1 \geq D_1$ is established, where $D_1$ is the diameter of the spacer 17 (a longer diameter of the spacer 17 in the thickness direction Y of the organic EL display device 1).

If the height $H_1$ of the first sealing member 5 is smaller than the diameter $D_1$ of the spacer 17 (i.e., $H_1 < D_1$), the first sealing member 5 is prevented from contacting the element substrate 30 when the element substrate 30 and the sealing substrate 20 are attached together via the first sealing member 5. In this case, a gap occurs between the first sealing member 5 and the element substrate 30, and therefore, it is difficult to shut out water and oxygen contained in ambient air using the first sealing member 5. In order to avoid such an adverse situation, the relationship $H_1 \geq D_1$ needs to be established.

<One Drop Fill Step>

Figure 10:
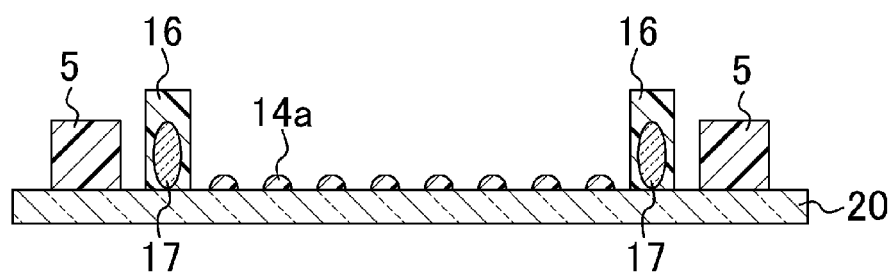
FIG. 10 is a diagram for describing the method for manufacturing the organic EL display device of the first embodiment of the present invention.

Next, as shown in FIGS. 10 and 11, a resin material 14a for forming the resin member 14 is dropped and injected inside the second sealing member 16 formed on the sealing substrate 20. Note that the resin material 14a is, for example, an ultraviolet curable resin, such as an acrylic resin, an epoxy resin, etc. The resin material 14a is dropped by, for example, a dropping apparatus which has a function of dropping the resin material 14a dropping the resin material 14a while moving over the entire substrate surface.

<Two-Substrate Structure Formation Step>

Figure 12:
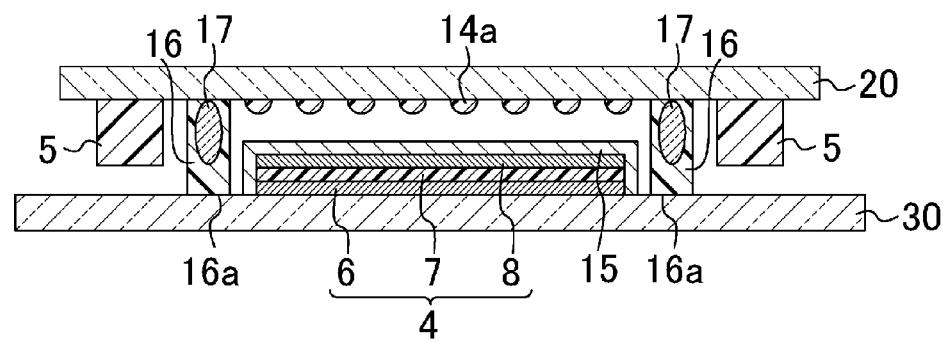
FIG. 12 is a diagram for describing the method for manufacturing the organic EL display device of the first embodiment of the present invention.

Next, in a vacuum atmosphere, the sealing substrate 20 on which the first sealing member 5 and the second sealing member 16 have been formed, and the element substrate 30 on which the organic EL element 4 has been formed, are attached together. Specifically, the sealing substrate 20 is put on the element substrate 30 with the resin material 14a being located directly above the organic EL element 4. As shown in FIG. 12, a surface 16a of the second sealing member 16 formed on the sealing substrate 20 is put on the element substrate 30.

Figure 13:
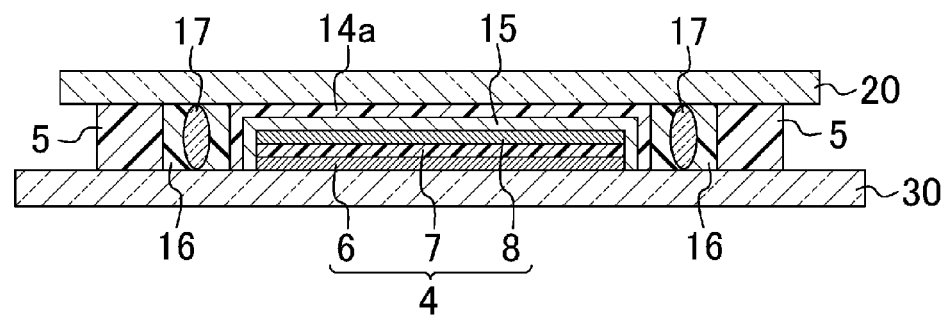
FIG. 13 is a diagram for describing the method for manufacturing the organic EL display device of the first embodiment of the present invention.

Next, as shown in FIG. 13, in a vacuum atmosphere, the hermetic (vacuum) state of the inside of the second sealing member 16 is maintained under a predetermined condition (e.g., under a pressure of 100 Pa or less). Thereafter, while the hermetic (vacuum) state is maintained, nitrogen leakage is performed and purging is performed to atmospheric pressure. Thus, by applying a differential pressure, the element substrate 30 and the sealing substrate 20 are attached together via the first sealing member 5 and the second sealing member 16 to form a two-substrate structure in which the element substrate 30 and the sealing substrate 20 are attached together.

Note that when the pressure is applied, the pressure is controlled so that the first sealing member 5 and the second sealing member 16 have the same height.

In this case, in this embodiment, as described above, the second sealing member 16 made of a resin functions as a pressure wall for maintaining the vacuum state of the inside of the attached substrates. Therefore, the vacuum state of the inside of the attached substrates in which the dropped and injected resin material 14a which will become the resin member 14 is provided, can be maintained. As a result, even if the resin material 14a is dropped and injected, then when the element substrate 30 and the sealing substrate 20 are attached together in a vacuum atmosphere, the dropped and injected resin material 14a can be uniformly spread inside the second sealing member 16 by applying a pressure.

<Resin Curing Step>

Figure 14:
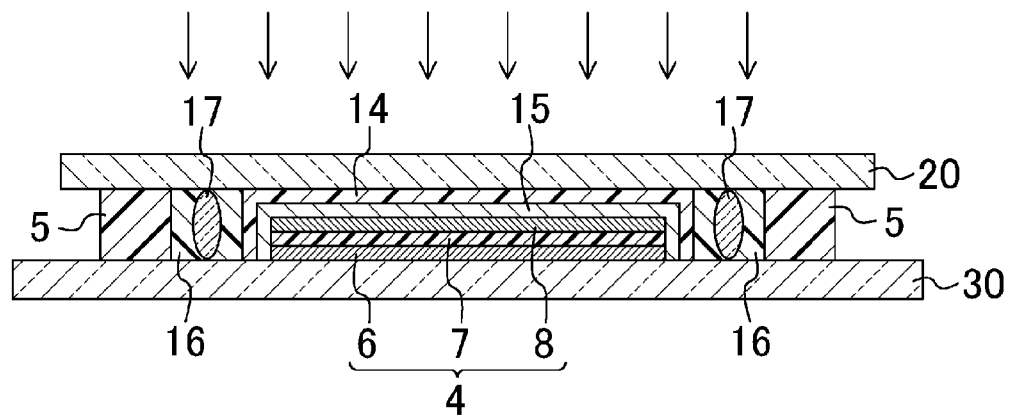
FIG. 14 is a diagram for describing the method for manufacturing the organic EL display device of the first embodiment of the present invention.

Next, as shown in FIG. 14, the two-substrate structure is irradiated with ultraviolet light (indicated by arrows in FIG. 14) through the sealing substrate 20 to cure the uniformly spread resin material 14a to form the resin member 14, and to cure the resin included in the second sealing member 16.

Note that the irradiation with ultraviolet light is preferably 0.5-10 J, more preferably 1-6 J. After the irradiation with ultraviolet light, heating is performed in the atmosphere (at 70° C. to 120° C., both inclusive, for 10 minutes to 2 hours, both inclusive).

<Welding Step>

Figure 15:
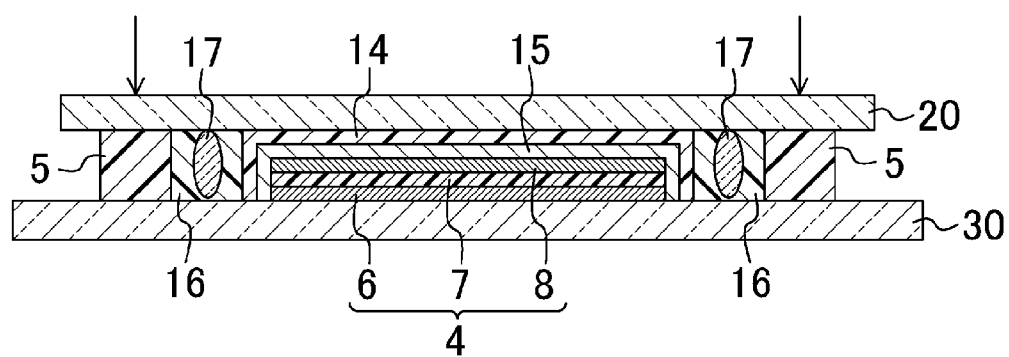
FIG. 15 is a diagram for describing the method for manufacturing the organic EL display device of the first embodiment of the present invention.

Next, as shown in FIG. 15, the two-substrate structure is irradiated with laser light (indicated by arrows in FIG. 15) using a laser light source, such as a YAG laser etc., through the sealing substrate 20, to selectively heat only the first sealing member 5 made of fritted glass, whereby the element substrate 30 and the sealing substrate 20 are welded by the first sealing member 5.

More specifically, for example, the YAG laser ($\lambda=1.06$ μm) has a power of 50-200 W, the aperture is narrowed to 0.1-1 mm using a fiber laser, a portion to which the fritted glass has been applied is irradiated with laser light through the glass. Thereafter, the YAG laser (laser light source) or the first sealing member 5 (target to be processed) is driven to heat and melt the fritted glass included in the first sealing member 5 to weld the element substrate 30 and the sealing substrate 20.

Here, in this embodiment, instead of heating an entire region in the width direction of the first sealing member 5 made of fritted glass, only a portion in the width direction is irradiated and heated with laser light, so that a non-irradiated region is provided. By this manner, damage to the organic EL element 4 due to heat transfer can be reduced.

Figure 16:
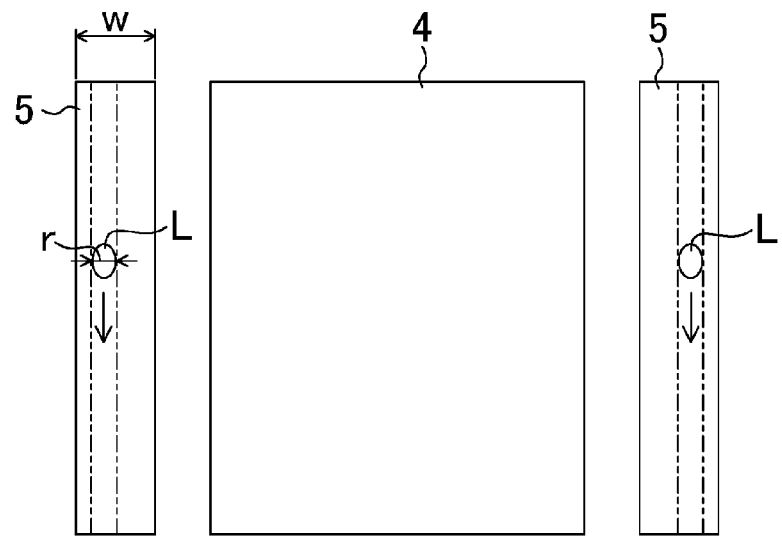
FIG. 16 is a diagram for describing a welding step in the method for manufacturing the organic EL display device of the first embodiment of the present invention.

More specifically, as shown in FIG. 16, a relationship $r < 0.5$ W is preferably established, where W is a width of the first sealing member 5, and r is an irradiation width of laser light L. For example, when the width W of the first sealing member 5 is 1 mm, the irradiation width r of the laser light L may be set to 0.4 mm.

With such a configuration, the first sealing member 5 has a region which is not heated, and therefore, the heat capacity of the first sealing member 5 is increased, whereby an increase in temperature of the inner portion of the first sealing member 5 can be reduced or avoided. Therefore, physical transfer to the organic EL element 4 of the temperature increase of the first sealing member 5 caused by the irradiation with the laser light L can be effectively reduced or prevented.

Note that the irradiation width r (i.e., welding width) of the laser light L is preferably in a range of 0.1 mm to 1 mm, both inclusive, more preferably in a range of 0.1 mm to 0.5 mm, both inclusive. This is because when the irradiation width r is larger than 1 mm, the area irradiated with the laser light L is close to the organic EL element 4, and therefore, it may be difficult to sufficiently reduce or avoid the influence of heat on the organic EL element 4, and when the irradiation width r is smaller than 0.1 mm, the welding by the first sealing member 5 is not sufficient, so that the first sealing member 5 may not have a sufficient function of shutting out water and oxygen contained in ambient air.

Figure 17:
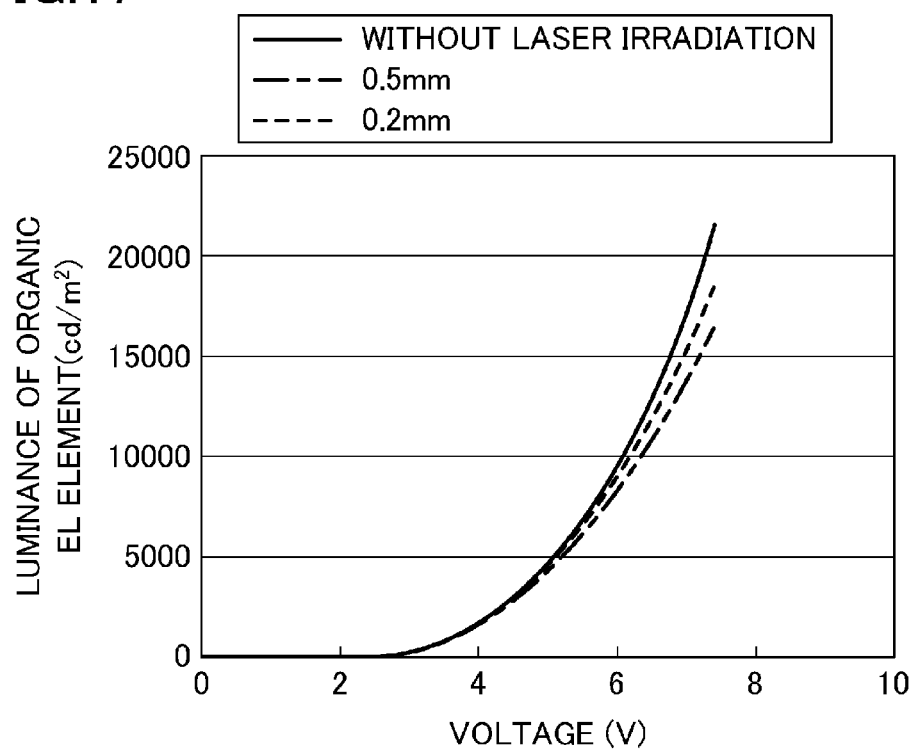
FIG. 17 is a diagram for describing characteristics of the organic EL element with respect to the irradiation width of laser light.

FIG. 17 shows characteristics (voltage versus luminance) of the organic EL element 4 which are obtained when the irradiation width r of the laser light L is set to 0.2 mm and 0.5 mm and when laser irradiation is not performed (i.e., there is not an influence of heat), where a distance between the first sealing member 5 made of fritted glass (width W=1 mm) and the organic EL element 4 is set to 5 mm.

As shown in FIG. 17, a higher luminance is obtained at a lower voltage (i.e., more excellent characteristics of the organic EL element 4) when the irradiation width r of laser light is small (r=0.2 mm) than when the irradiation width r of laser light is large (r=0.5 mm).

As can be seen from the above results, the fritted glass functions as a heat sink, and the influence of heat on the organic EL element 4 can be reduced or avoided by selectively heating a portion of the first sealing member 5 instead of heating the entire first sealing member 5.

According to this embodiment described above, the following advantages can be obtained.

(1) In this embodiment, the second sealing member 16 formed of a resin is provided between the element substrate 30 and the sealing substrate 20. Therefore, the second sealing member 16 formed of a resin, which is flexible, functions as a pressure wall for maintaining the vacuum state of the inside of the attached substrates (i.e., the element substrate 30 and the sealing substrate 20), and therefore, the resin member 14 can be formed using the one drop filling technique. As a result, the resin member 14 having a small thickness can be formed. The thinner resin member 14 can reduce the amount of a resin material used to form the resin member 14 even in a large-size organic EL display device. As a result, an increase in cost can be reduced.

(2) Because the thickness of the resin member 14 is reduced, the thickness of the first sealing member 5 made of fritted glass can also be reduced. As a result, the heating energy which is required when a laser is used to perform welding using the first sealing member 5 made of fritted glass can be reduced. As a result, an increase in cost can be reduced.

(3) Because the thickness of the resin member 14 can be prevented from being greater than the thickness of the first sealing member 5, a gap can be prevented from occurring between the first sealing member 5 and the element substrate 30. Therefore, the first sealing member 5 can reliably shut out water and oxygen contained in ambient air, and therefore, the reduction in the sealing performance of the first sealing member 5 can be reliably reduced or prevented.

(4) Because the resin member 14 is formed using the one drop filling technique, the positioning accuracy can be improved when the resin member 14 is formed. Therefore, the production step of the resin member 14 can be simplified, whereby the productivity of the organic EL display device 1 can be improved and therefore the yield can be increased.

(5) In this embodiment, the second sealing member 16 contains the spacer 17 for regulating the thickness of the resin member 14. Therefore, even when the resin member 14 is formed using the one drop filling technique, the thickness of the resin member 14 can be accurately regulated.

(6) In this embodiment, the relationship $H_1 \geq D_1$ is established, where $H_1$ is the height of the first sealing member 5, and $D_1$ is the diameter of the spacer 17. Therefore, if the first sealing member 5 is provided on the sealing substrate 20, then when the element substrate 30 and the sealing substrate 20 are attached together via the first sealing member 5, the first sealing member 5 and the element substrate 30 are allowed to reliably contact each other, whereby a gap can be reliably prevented from occurring between the first sealing member 5 and the element substrate 30.

(7) In this embodiment, the second sealing member 16 is provided inside the first sealing member 5 in the plane direction X of the organic EL display device 1. Therefore, the second sealing member 16 can separate the resin member 14 apart from the first sealing member 5, whereby heat transfer to the organic EL element 4 can be reduced when the first sealing member 5 is heated to weld the element substrate 30 and the sealing substrate 20. Also, it is possible to reduce or prevent alteration of the resin member 14 which is caused by heat when the first sealing member is melted. Specifically, alteration of the resin member 14 caused by heat, such as carbonization, yellowing, etc., can be reduced or prevented, whereby a change in visual perception of the resin member 14 can be reduced or prevented.

(8) In this embodiment, the second sealing member 16 is formed of an acrylic resin or an epoxy resin. Therefore, the second sealing member 16 can be formed of a low-cost and versatile resin material.

(9) In this embodiment, on the surface of the organic EL element 4, the protection film 15 is provided which is used to prevent the organic EL element 4 and the resin member 14 from contacting each other, thereby protecting the organic EL element 4. Therefore, even when the resin member 14 is provided over the surface of the organic EL element 4, the organic EL element 4 can be reliably protected.

Second Embodiment

Figure 18:
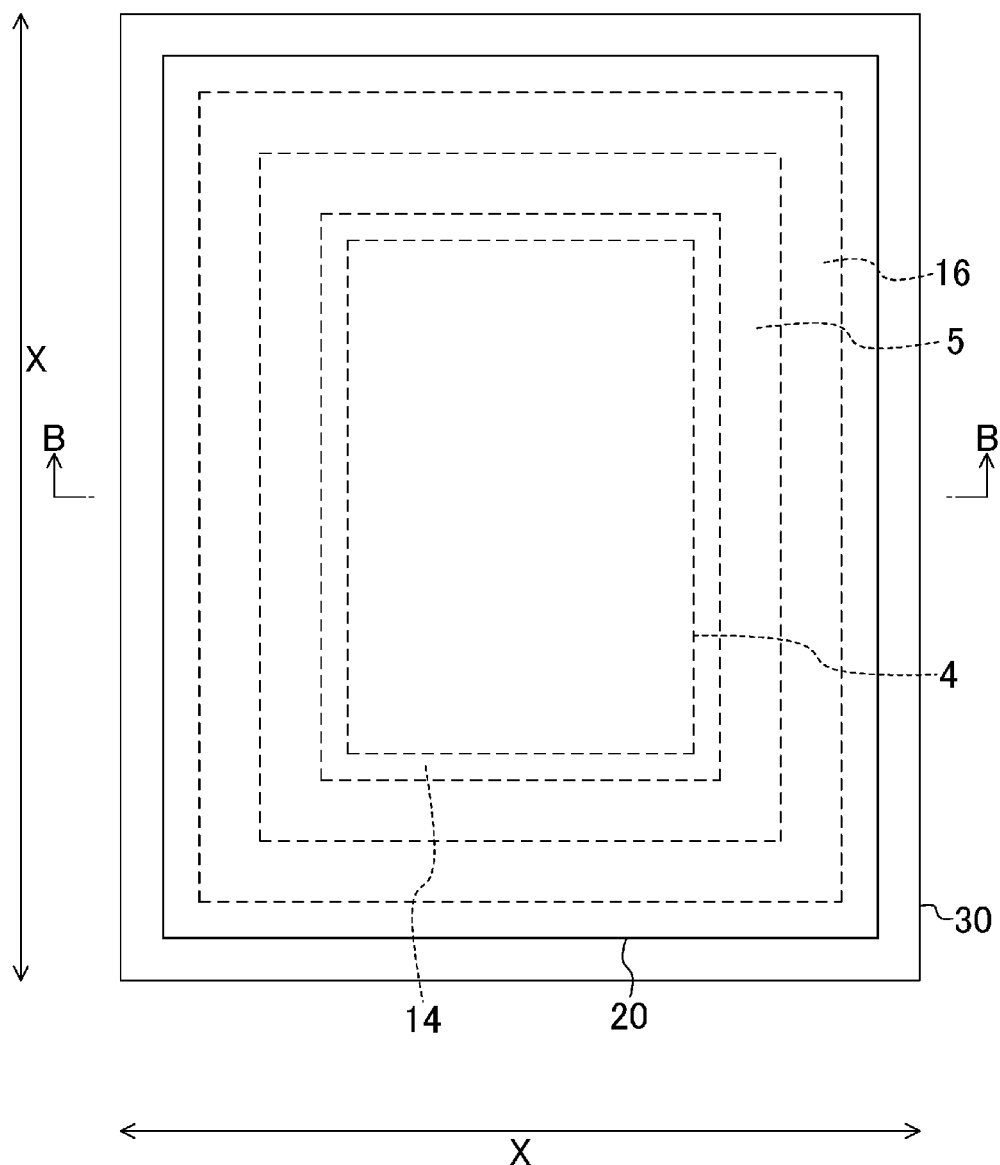
FIG. 18 is a plan view of an organic EL display device according to a second embodiment of the present invention.
Figure 19:
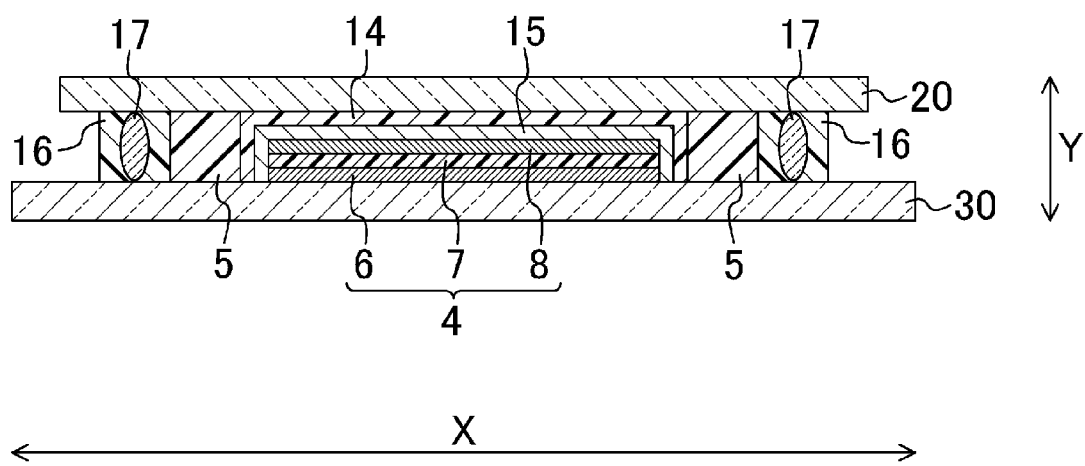
FIG. 19 is a cross-sectional view taken along line B-B of FIG. 18.

Next, a second embodiment of the present invention will be described. FIG. 18 is a plan view of an organic EL display device according to the second embodiment of the present invention. FIG. 19 is a cross-sectional view taken along line B-B of FIG. 18. Note that parts similar to those of the first embodiment are indicated by the same reference characters and will not be described. The organic EL display device is manufactured by a method similar to that described in the first embodiment, and the method will not be described in detail.

In the organic EL display device 40 of this embodiment, as shown in FIGS. 18 and 19, the positions of the first sealing member 5 and the second sealing member 16 described in the first embodiment are switched.

More specifically, as shown in FIGS. 18 and 19, in this embodiment, the second sealing member 16 is provided outside the first sealing member 5 in the plane direction X of the organic EL display device 1. The first sealing member 5 is provided between the organic EL element 4 (or the resin member 14) and the second sealing member 16 in the plane direction X of the organic EL display device 1 (i.e., on a side closer to the organic EL element 4 (or the resin member 14) of the second sealing member 16 in the plane direction X).

Thereafter, in this embodiment, the first sealing member 5 made of fritted glass provided inside the second sealing member 16 functions as a member for sealing the resin member 14.

Also in this embodiment, similar to the first embodiment, the second sealing member 16 contains a spacer 17 having a smaller height than that of the first sealing member 5. The spacer 17 regulates the thickness of the resin member 14.

According to this embodiment described above, the following advantage can be obtained in addition to the advantages (1)-(9) described above.

(10) In this embodiment, the second sealing member 16 is provided outside the first sealing member 5 in the plane direction X of the organic EL display device 1. Therefore, when the second sealing member 16 is formed after the first sealing member 5 is formed, the second sealing member 16 is more easily formed.

Third Embodiment

Figure 20:
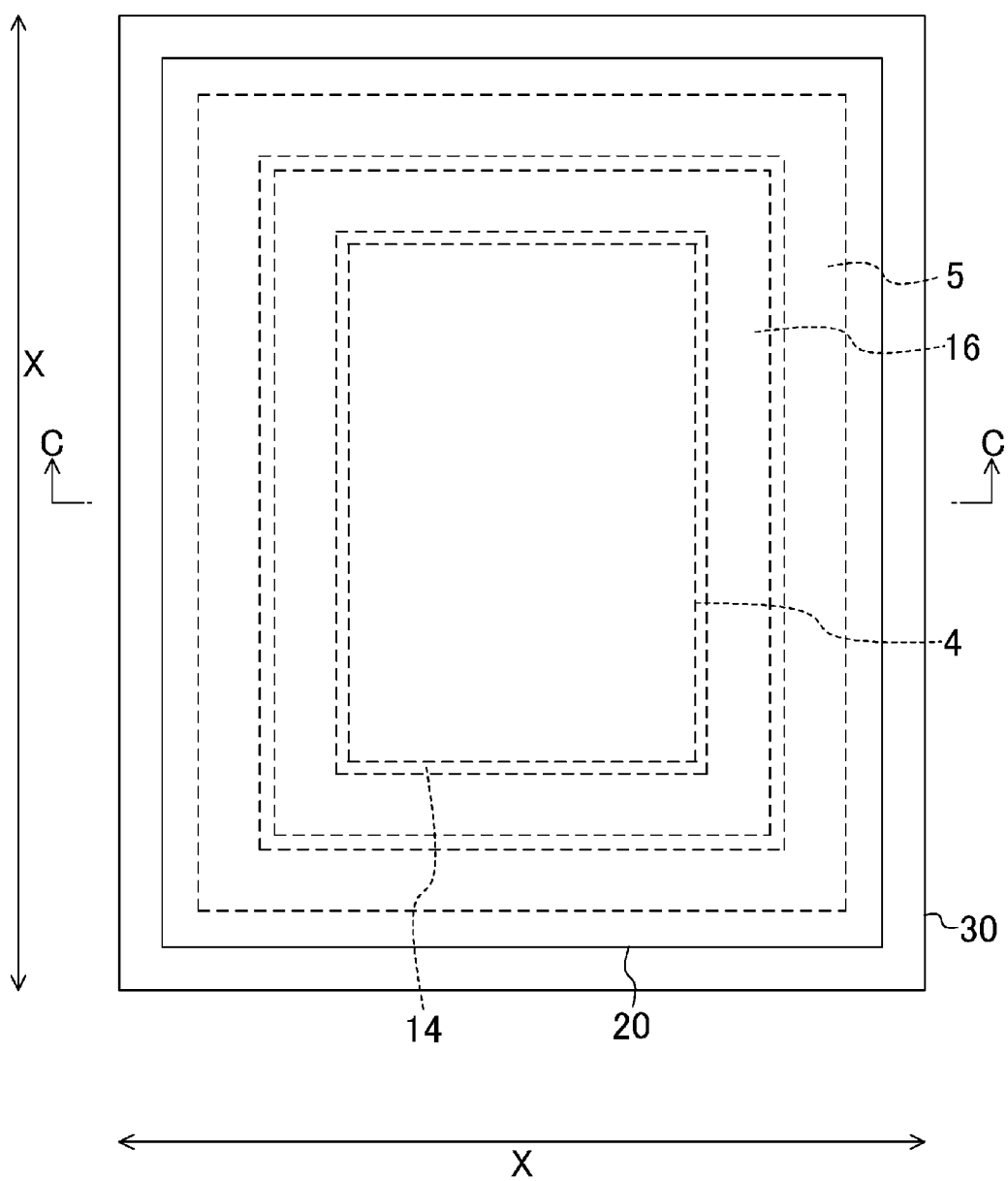
FIG. 20 is a plan view of an organic EL display device according to a third embodiment of the present invention.
Figure 21:
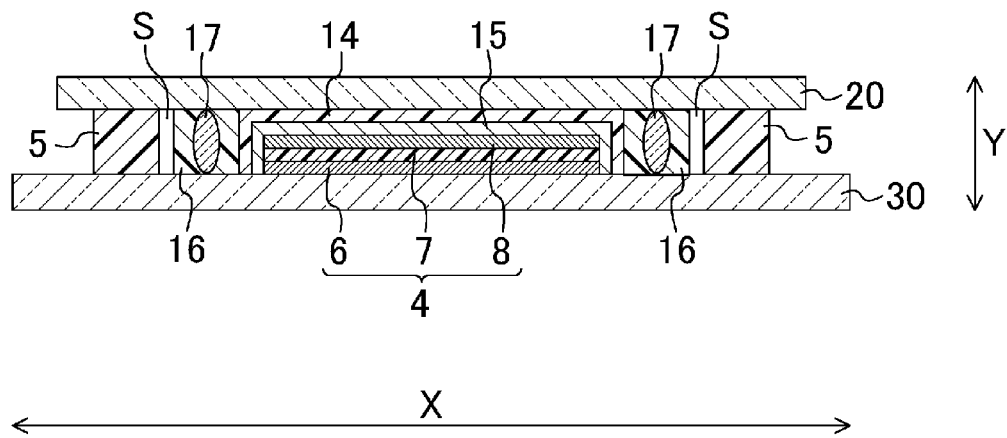
FIG. 21 is a cross-sectional view taken along line C-C of FIG. 20.

Next, a third embodiment of the present invention will be described. FIG. 20 is a plan view of an organic EL display device according to the third embodiment of the present invention. FIG. 21 is a cross-sectional view taken along line C-C of FIG. 20. Note that parts similar to those of the first embodiment are indicated by the same reference characters and will not be described. The organic EL display device is manufactured by a method similar to that described in the first embodiment, and the method will not be described in detail.

In the organic EL display device 50 of this embodiment, as shown in FIGS. 20 and 21, the first sealing member 5 and the second sealing member 16 are separated apart from each other in the plane direction X of the organic EL display device 50 (i.e., a space S is formed between the first sealing member 5 and the second sealing member 16).

With such a configuration, as described above, even when the first sealing member 5 made of fritted glass is melted by heating, transfer of heat used for the melting to the second sealing member 16 can be reduced or prevented.

Note that a distance between the first sealing member 5 and the second sealing member 16 is not particularly limited and may be a distance which can reduce or prevent the transfer of heat used for the melting to the second sealing member 16.

According to this embodiment described above, the following advantage can be obtained in addition to the advantages (1)-(9) described above.

(11) In this embodiment, the first sealing member 5 and the second sealing member 16 are separated apart from each other in the plane direction X of the organic EL display device 50. Therefore, transfer to the second sealing member 16 of heat occurring when the element substrate 30 and the sealing substrate 20 are welded by heating the first sealing member 5 made of fritted glass can be reduced or prevented. As a result, alteration of the second sealing member 16 formed of a resin due to heat can be reduced or prevented.

Note that the above embodiments may be modified as follows.

Figure 22:
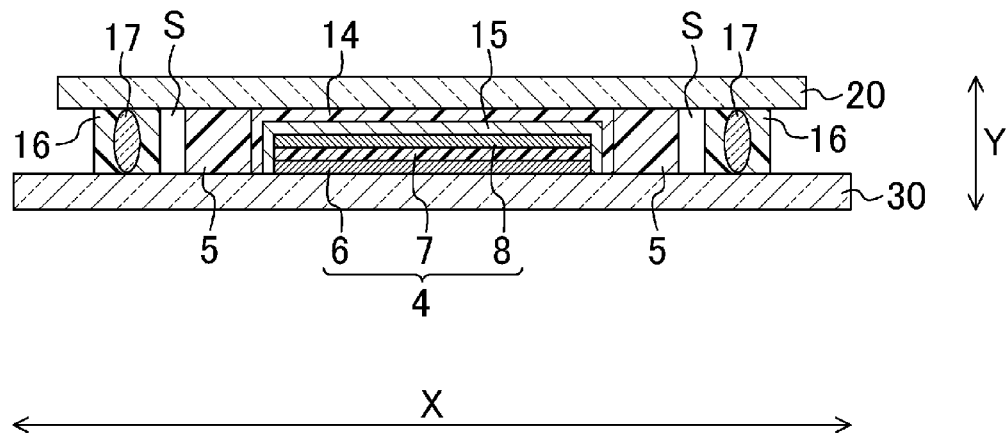
FIG. 22 is a cross-sectional view for describing a variation of the organic EL display device of the present invention.

As shown in FIG. 22, also in the second embodiment, similar to the third embodiment, the first sealing member 5 and the second sealing member 16 may be separated apart from each other (i.e., a space S may be formed between the first sealing member 5 and the second sealing member 16).

Figure 23:
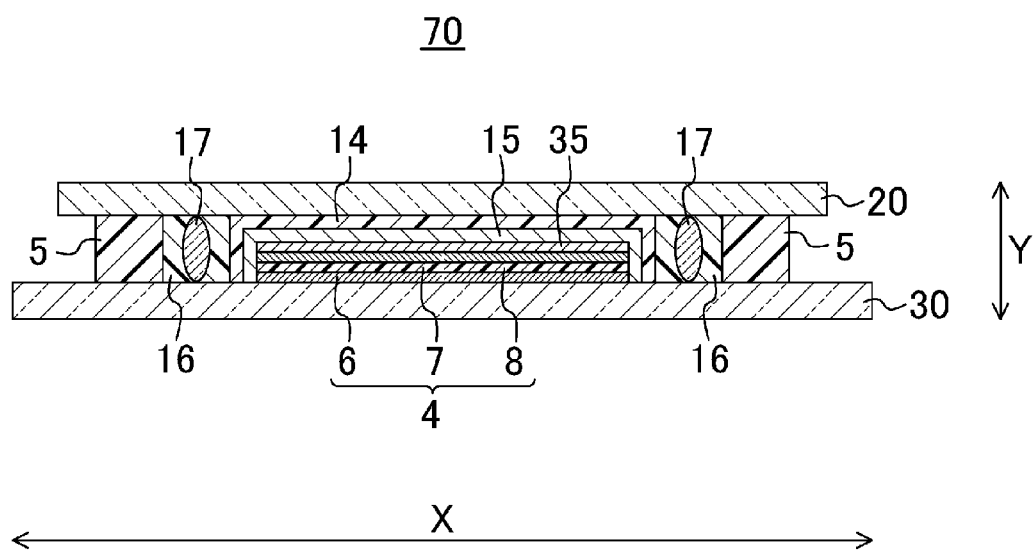
FIG. 23 is a cross-sectional view for describing another variation of the organic EL display device of the present invention.

As shown in FIG. 23, a light blocking member 35 having a capability of transmitting visible light and a capability of blocking ultraviolet light may be provided on a surface of the organic EL element 4 (i.e., a surface of the second electrode 8 of the organic EL element 4). With such a configuration, in the resin curing step, when the resin member 14 and the second sealing member 16 are formed by irradiation with ultraviolet light through the sealing substrate 20, ultraviolet light entering the organic EL element 4 can be reliably reduced or prevented. As a result, a degradation in the organic EL element 4 caused by irradiation with ultraviolet light (i.e., each functional layer included in the organic layer 7 is chemically changed so that the functional layer fails to exhibit its original function) can be reduced or prevented. Also, the light blocking member 35 has a capability of transmitting visible light, and therefore, light emitted from the organic EL element 4 can be extracted through the sealing substrate 20. Therefore, the organic EL display device 1 is applicable to any of the following types: bottom emission type, in which light is extracted through the element substrate 30; top emission type, in which light is extracted through the sealing substrate 20; and double-sided emission type, in which light is extracted through both the element substrate 30 and the sealing substrate 20.

Note that, also in the second and third embodiments, similar to the case of FIG. 23, the light blocking member 35 having a capability of transmitting visible light and a capability of blocking ultraviolet light may be provided on the surface of the organic EL element 4 (i.e., the surface of the second electrode 8 of the organic EL element 4).

The light blocking member 35 is not particularly limited, and may be, for example, a film made of a material having a capability of absorbing ultraviolet light, a film coated with a coating agent containing an ultraviolet light absorbent, etc. Alternatively, the light blocking member 35 may be provided by forming directly on the surface of the second electrode 8 a coating film made of a coating agent containing an ultraviolet light absorbent. Alternatively, the light blocking member 35 may be provided by forming directly on the surface of the second electrode 8 a vapor deposition film by depositing an ultraviolet light absorbent using vapor deposition etc.

A material for the film having a capability of absorbing ultraviolet light may be, for example, a material including a resin binder and an ultraviolet light absorbent contained in the resin binder. Examples of the ultraviolet light absorbent include inorganic ultraviolet light absorbents, such as ultra small particles made of zinc oxide, titanium oxide, etc., and organic ultraviolet light absorbents, such as benzotriazoles, triazines, benzophenones, etc.

The coating agent containing an ultraviolet light absorbent may be, for example, a mixture of acrylic emulsion or a coating solution containing low molecular-weight thermosetting urethane acrylate and a catalyst etc., and an ultraviolet light absorbent, which is prepared by wet dispersion.

Note that the light blocking member 35 preferably has an ultraviolet light blocking rate of 90% or more, more preferably 95% or more, and even more preferably 98% or more. This is because if the ultraviolet light blocking rate is less than 90%, it is difficult to impart a sufficient ultraviolet light blocking function to the light blocking member 35, so that the function of each functional layer included in the organic layer 7 may be degraded.

The light blocking member 35 may be formed as follows. In the organic EL element formation step, after the second electrode 8 may be formed, a benzotriazole derivative layer may be formed on the second electrode 8 by, for example, vacuum vapor deposition. Note that the vapor deposition rate may be 0.5 Å/s, and the thickness may be adjusted so that the ultraviolet light blocking rate is 95% or more.

INDUSTRIAL APPLICABILITY

As described above, the present invention is useful for an organic EL display device including an organic EL element, and a method for manufacturing the organic EL display device.

DESCRIPTION OF REFERENCE CHARACTERS

1 ORGANIC EL DISPLAY DEVICE
4 ORGANIC EL ELEMENT
5 FIRST SEALING MEMBER
6 FIRST ELECTRODE
7 ORGANIC LAYER
8 SECOND ELECTRODE
14 RESIN MEMBER
15 PROTECTIVE FILM
16 SECOND SEALING MEMBER
17 SPACER
20 SEALING SUBSTRATE (SECOND SUBSTRATE)
30 ELEMENT SUBSTRATE (FIRST SUBSTRATE)
35 Light Blocking Member
40 ORGANIC EL DISPLAY DEVICE
50 ORGANIC EL DISPLAY DEVICE
60 ORGANIC EL DISPLAY DEVICE
70 ORGANIC EL DISPLAY DEVICE

The invention claimed is:

1. An organic EL display device comprising:
   a first substrate;
   a second substrate facing the first substrate;
   an organic EL element formed on the first substrate and provided between the first substrate and the second substrate;
   a first sealing member formed of fritted glass and provided between the first substrate and the second substrate, and configured to weld the first substrate and the second substrate to seal the organic EL element;
   a resin member provided between the second substrate and the organic EL element and configured to cover a whole surface of the organic EL element; and
   a second sealing member made of a resin and provided between the first substrate and the second substrate, and functioning as a pressure wall for maintaining a vacuum state of an inside of a space sandwiched by the first substrate and the second substrate.

2. The organic EL display device of claim 1, wherein the second sealing member contains a spacer configured to regulate a thickness of the resin member.

3. The organic EL display device of claim 2, wherein the spacer has an elliptic cross-section, and
   a relationship $H_1 \geq D_1$ is established, where $H_1$ is a height of the first sealing member, and $D_1$ is a diameter of the spacer.

4. The organic EL display device of claim 1, wherein the second sealing member is provided inside the first sealing member in a plane direction of the organic EL display device.

5. The organic EL display device of claim 1, wherein the second sealing member is provided outside the first sealing member in a plane direction of the organic EL display device.

6. The organic EL display device of claim 1, wherein the first sealing member and the second sealing member are separated apart from each other in a plane direction of the organic EL display device.

7. The organic EL display device of claim 1, wherein the resin is an acrylic resin or an epoxy resin.

8. The organic EL display device of claim 1, wherein a light blocking member having a capability of transmitting visible light and a capability of blocking ultraviolet light is provided on a surface of the organic EL element.

9. The organic EL display device of claim 1, wherein the resin member has a thickness of in a range of 3 μm to 20 μm, both inclusive.

10. A method for manufacturing the organic EL display device of claim 1, comprising at least:
    an organic EL element formation step of forming an organic EL element on a first substrate;
    a first sealing member formation step of forming a frame-like first sealing member made of fritted glass on a second substrate;
    a second sealing member formation step of forming a frame-like second sealing member made of a resin on the second substrate on which the first sealing member has been formed;
    a one drop filling step of dropping and injecting a resin material for forming a resin member inside the second sealing member formed on the second substrate;
    a two-substrate structure formation step of attaching the first substrate and the second substrate together with the first sealing member and the second sealing member being interposed therebetween, in a vacuum atmosphere, and allowing the resin material to uniformly spread inside the second sealing member;
    a resin curing step of curing the resin material to form the resin member and curing the resin included in the second sealing member; and
    a welding step of heating the first sealing member made of fritted glass to weld the first substrate and the second substrate using the first sealing member.

11. The method of claim 10, wherein in the welding step, only a portion in a width direction of the first sealing member is heated.

* * * * *